(12) United States Patent
Shum et al.

(10) Patent No.: US 6,909,139 B2
(45) Date of Patent: Jun. 21, 2005

(54) ONE TRANSISTOR FLASH MEMORY CELL

(75) Inventors: Danny Shum, Austin, TX (US); Georg Tempel, Sterrebeek (BE); Ronald Kakoschke, Munich (DE)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 10/607,610

(22) Filed: Jun. 27, 2003

(65) Prior Publication Data

US 2004/0262669 A1 Dec. 30, 2004

(51) Int. Cl.[7] .............................................. H01L 29/788
(52) U.S. Cl. ..................................... 257/315; 257/318
(58) Field of Search ................................. 257/315, 318

(56) References Cited

U.S. PATENT DOCUMENTS

| | | | |
|---|---|---|---|
| 5,635,415 A | | 6/1997 | Hong |
| 5,644,532 A | * | 7/1997 | Chang .................... 365/185.16 |
| 6,307,781 B1 | | 10/2001 | Shum |
| 6,327,182 B1 | | 12/2001 | Shum et al. |
| 6,438,030 B1 | | 8/2002 | Hu et al. |

FOREIGN PATENT DOCUMENTS

WO    WO 02/15190 A2    2/2002

OTHER PUBLICATIONS

Chi–Nan Brian Li et al., "A Novel Uniform–Channel–Program–Erase (UCPE) Flash EEPROM Using an Isolated P–well Structure", IEEE, 2000 (Apr. 2000) 0–7803–6441–4/00.

Evans Ching–Song Yang, et al., "Novel Bi–Directional Tunneling Program/Erase NOR(BiNOR)–Type Flash EEPROM", IEEE 1999, 0018–9383/99, Voil 46, No. 6, Jun. 1999, pp. 1294–1296.

* cited by examiner

*Primary Examiner*—David Nelms
*Assistant Examiner*—Tu-Tu Ho
(74) *Attorney, Agent, or Firm*—Thomas R. FitzGerald, Esq.

(57) ABSTRACT

An integrated circuit has a high voltage area, a logic area and a memory array for forming a system on a chip that includes linear, logic and memory devices. The memory array has floating gate transistors disposed in a triple well structure with a raised drain bit line 13 substantially vertically aligned with a buried source bit line 14. The memory array separates the columns with deep trenches 46 that may also be formed into charge pump capacitors.

30 Claims, 7 Drawing Sheets

ONE TRANSISTOR FLASH MEMORY CELL

BACKGROUND

Flash memory cells have enjoyed recent commercial success due to their relatively low cost, the ease in erasing information stored in a flash memory array and their applications to bank check cards, credit cards, and the like. There is no current industry standard flash memory cell. Many types of flash memories exist which embody many different architectures. The programming, reading and erasing of cells can be generally described under one of the following architectures—NOR, AND, or NAND. Further, the programming mechanism of the flash memory cell typically involves Fowler-Nordheim tunneling through an energy barrier or electron injection over an energy barrier.

The array erase mechanism for Fowler-Nordheim cells can involve floating gate to channel, floating gate to drain or floating gate to source as the charge clearing path from the floating gate. The floating gate to drain or source path can prove deleterious to cell operation by destroying the tunnel oxide area located between the floating gate overlap and the drain/source region. The tunnel oxide may also be destroyed through the Fowler-Nordheim programming mechanism or by electron injection (e.g., programming a logic one or logic zero on the floating gate) of conventional flash cells. These programming mechanisms may include charge carrier paths between the floating gate and drain or alternatively between the floating gate and source. However, conventional cells in NOR or AND architectures do not include a programming operation involving a path between the channel and floating gate. Such an operation would be desirable from a standpoint of limiting tunnel oxide degradation due to the field re-distribution effect across the entire tunnel oxide region. In my U.S. Pat. No. 6,307,781 I disclose and claim a triple well structure for a floating gate transistor that permits uniform channel programming. That structure reduces tunnel oxide damage by permitting a uniform voltage across the channel during programming and erasing.

Flash memory cells are often fabricated on the same substrate with logic or linear transistors. In order to have an efficient manufacturing process, the transistors for the control gate in the flash memory cells and the logic and linear transistors often share the same polysilicon mask. They also share the same sidewall oxidation process and the same reactive ion etch (RIE) of the gate. While the sharing of common steps is efficient, it also presents one or more technical problems. As features sizes shrink, logic and/or linear transistors require ultra shallow source and drain junction formation to avoid short channel effect (SCE). In order to achieve such ultra shallow source and drain junction formation the thermal budget for manufacturing the device must be kept very low. In my copending U.S. patent application Ser. No. 10/234,344, filed Sep. 4, 2002 I disclose a method for making flash memories and logic and linear devices on the same substrate.

Despite the above developments, there still remain a number of problems for integrating non-volatile memory technology with conventional CMOS logic and linear devices and processes. I have found that uniform channel programming as employed in NAND or AND architectures extend the scaling limit of memory technology because no voltage differential is applied between the drain and the source during programming or erasing. That is, the bias for the source, the drain, and the well are the same, Vsource=Vdrain=Vwell. However, NAND devices suffer from slow reading times due to their inherent serial access mode. In addition; AND devices require dedicated and separate source and drain bit lines. As such, the conventional metal pitch of an AND memory device requires two metal lines with space in between them in order to separate the source bit line from the drain bit line. Other problems with prior art combination devices is that conventional uniform channel programming in such devices share a well for a common body contact. This common body contact may cause gate induced drain leakage current during programing among the unselected cells. With prior art flash memory devices, a single power supply was provides for VCC. All voltages used in the devices were generated on-board and they require large charge pump areas to sustain the leakage due to the gate induced drain leakage. Also, certain high voltage devices when formed on the same substrate, require or use conventional shallow trench isolation and need large N+/N+ spacing. In other words, they need large peripheral areas.

No one prior art solution addresses all of these problems. It is known in certain uniform channel programming architecture that one may provide N+ buried bit lines. It is also known that the spacing between surface bit lines can be improved by arranging the lines in a jogged manner or by jogging the source and drain contacts. Still others have used isolated P-wells and/or local P-well technology. However, no one of these prior techniques addresses all of the issues raised above.

SUMMARY

The invention provides a flash memory array and a method of making the flash memory array in a semiconductor substrate. The array includes a plurality of floating gate transistors arranged in rows and columns. The sources and drains of the transistors are arranged serially in columns and are aligned with each other in each column. Each source is separated from each drain by a floating gate. The transistors are arranged so that serially adjacent transistors share a common source or common drain. The sources are connected together in the substrate to form a buried bit line. A P+ body tie is implanted in a number of the sources to eliminate the need for a common well to provide the body contact. The drains are connected together over the substrate by raised bit lines. They are formed from a layer of conductive material, such as metal, that is patterned into lines that extend the length of the columns. The raised bit lines are vertically aligned with the buried bit lines so that the overall dimensions of the array are small. By aligning the bit lines in each column with each other, the active areas on the surface of the array are efficiently used to maximize the density of the array and to minimize the areas devoted to contact regions. The transistors of the array are formed in a triple well that includes P-type substrate, a deep N-well and a shallow P-well enclosed in the deep N-well. Adjacent columns are isolated by deep trenches that extend below the shallow P-well and into the deep N-well.

DRAWINGS

DETAILED DESCRIPTION

Figure 1:
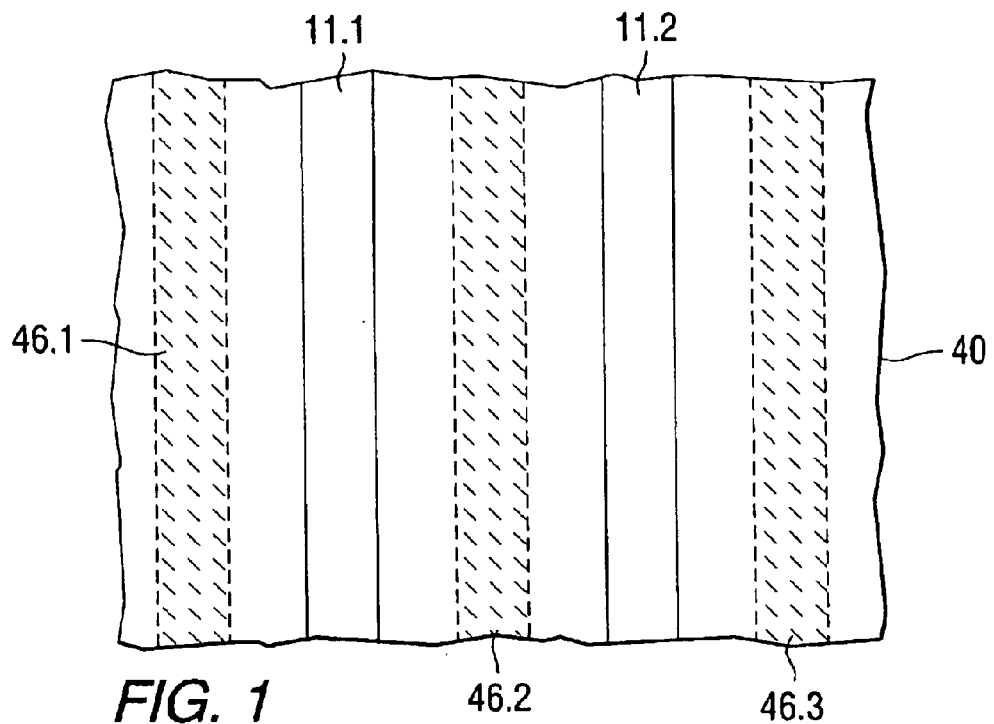
FIG. 1 is plan view of a substrate with columns for the sources and drains.
Figure 2:
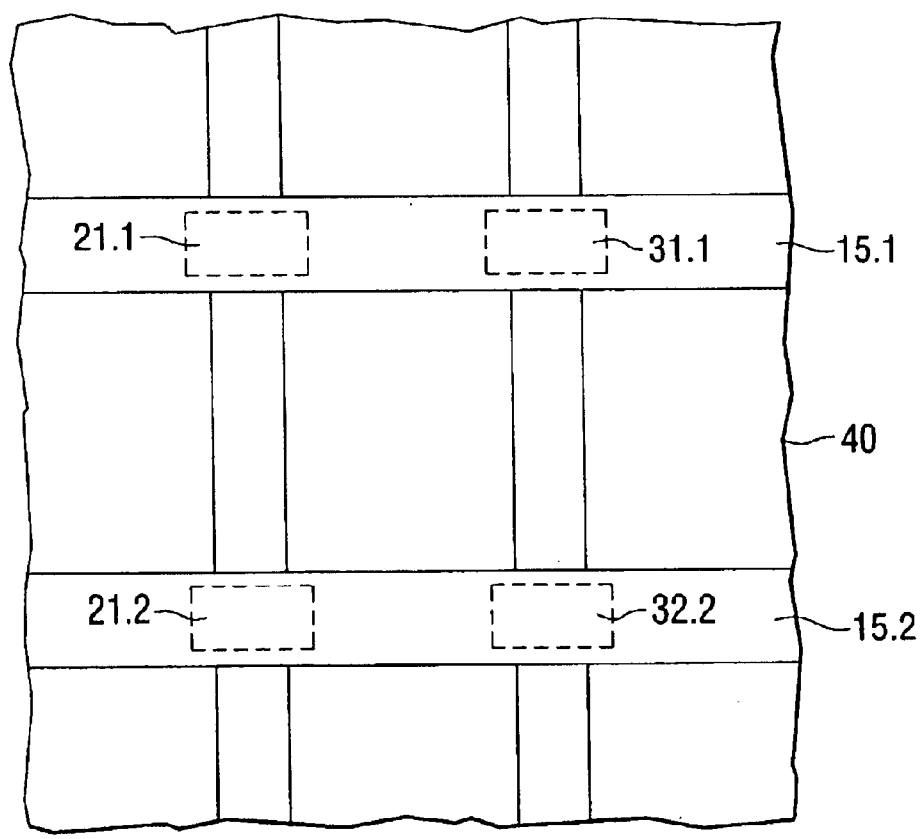
FIG. 2 is a plan view of the substrate where word lines with floating gates are formed in rows across the columns.

Turning to FIG. 1, there is shown a P-type substrate 40. A deep N-well 41 is formed in the substrate 40 and a number of high voltage (HV) P-wells 42 are formed in the deep N-well. The surface of the substrate 40 is masked with a screen oxide 45 or other suitable mask to form openings 11.1, 11.2, ... 11.n for the columns of the array. The active areas in a column are isolated from adjacent active areas by deep trenches 46.1, 46.2, 46.3, ... 46.n that extend below the deep N-well 41. In order to explain the rest of the structure, the deep trenches are omitted from FIGS. 2 and 3. Progressing to FIG. 2, the substrate 40 is further processed to form a plurality of word lines 15.1, 15.2, ... 15.n that extend as rows that cross the columns 11.n. For each transistor a floating gate structure is formed over the crossing of the word line and the column.

Common sources such as 22, 27 and 32, 37 are formed between the word lines. A P+ body implant 24, 34 is made into the source region. The source diffusion forms, in effect, a common, buried source bit line 14. A raised common drain bit line 13 will be formed later in the process over the buried source bit line so that the source and drain bit lines will be substantially vertically aligned with each other.

Figure 3:
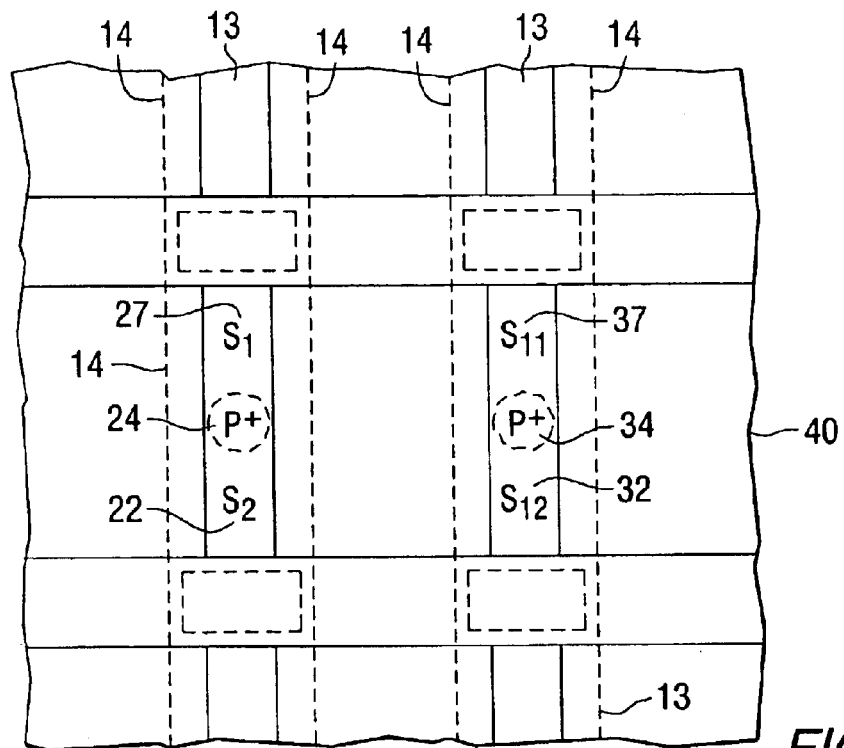
FIG. 3 is a further view of FIG. 2 where the sources and the body ties are formed in the columns of the array.
Figure 4:
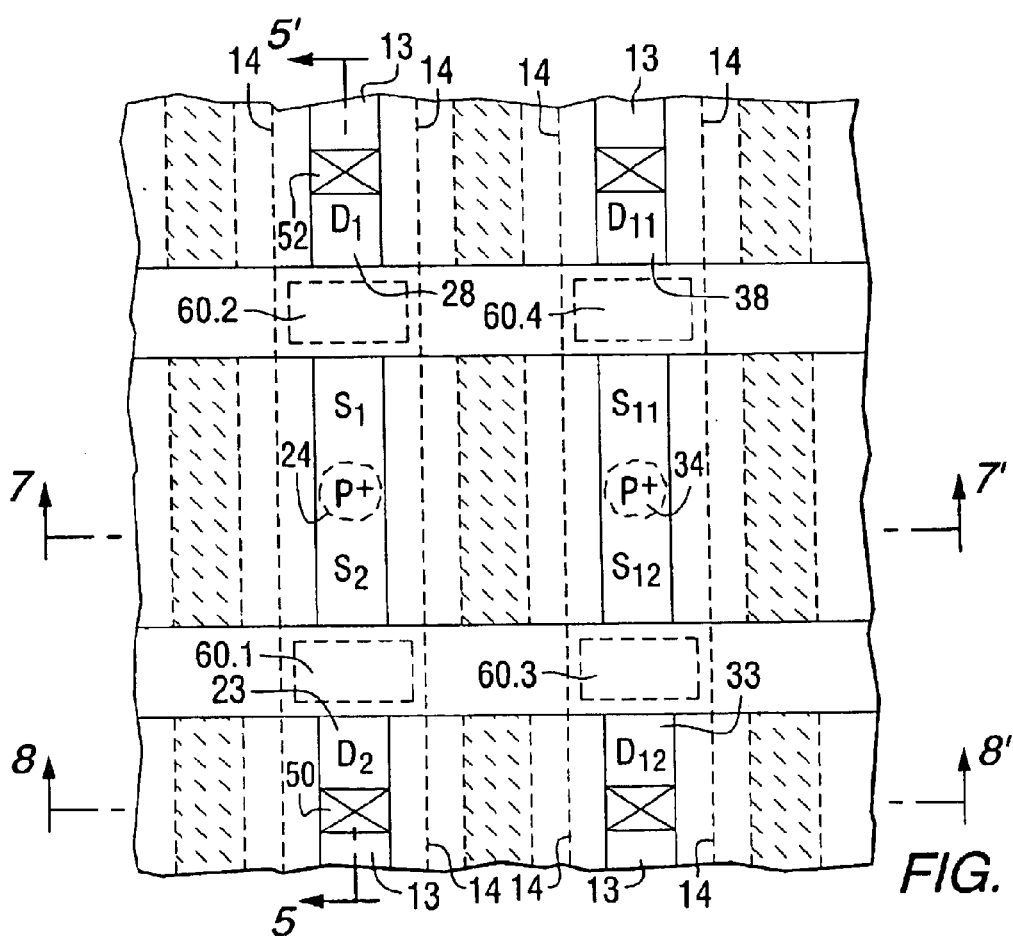
FIG. 4 is a further view where drains are formed.
Figure 8:
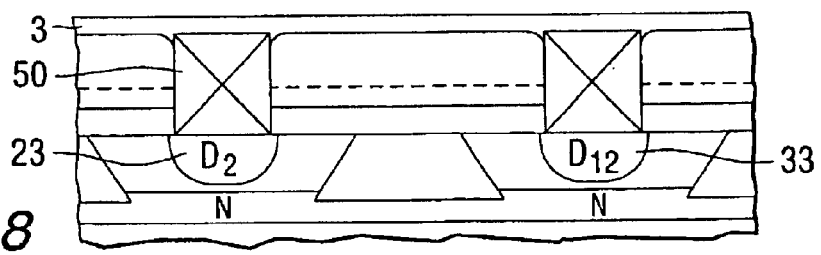
FIG. 8 is a cross sectional view taken along the line of 8–8' and through drain regions in adjacent columns.

The drain regions, such as 23, 28 and 33, 38 are shown in FIG. 4. The raised drain bit lines 13 are formed from metal 1 that passes through vias to contact the drains. As shown in FIGS. 3, 4 the raised bit line 13 is connect to the drains and the buried bit line 14 is connected to the sources. They occupy about the same planar location but are separated vertically from each other. For purposes of illustration, the buried bit line 14 is shown in dashed outline in both figures and is wider than the raised bit line 13. In practice, the lines may be the same or different widths. Each combined drain region has a contact 50n that extends to the surface of the device. The contacts 50n are isolated from each other and from the floating gate stack 60.n, 61.n, 62.n, 63.n. The contacts 50n extend vertically through the isolation layer 54 to contact the drain regions 23, 28, 33, 38 on the surface of the substrate 40, as shown in FIGS. 4, 8. The contacts are formed by opening vias in the insulation layer, depositing a layer of metal 500 over the insulation layer 54 and in its vias, and then patterning the metal layer 500 into a set of metal lines 500.1, 500.2, ... 5000.n that form the raised bit lines of the array, one metal line per bit line.

Both of these wells (HV P-wells and deep N-wells) are to be shared in the memory region as well as in the HV peripheral regions to reduce mask costs. The wells are formed with a high energy implant process that is known as the "retrograde well process" in the semiconductor industry. The implant has a depth profile that is typically greater than 0.7 $\mu$m for P and greater than 1.5 $\mu$m for N. That profile is necessary in order for the memory to generate sufficient high voltage, typically greater than 12V, to avoid junction punch-through for write and erase operations.

Figure 5:
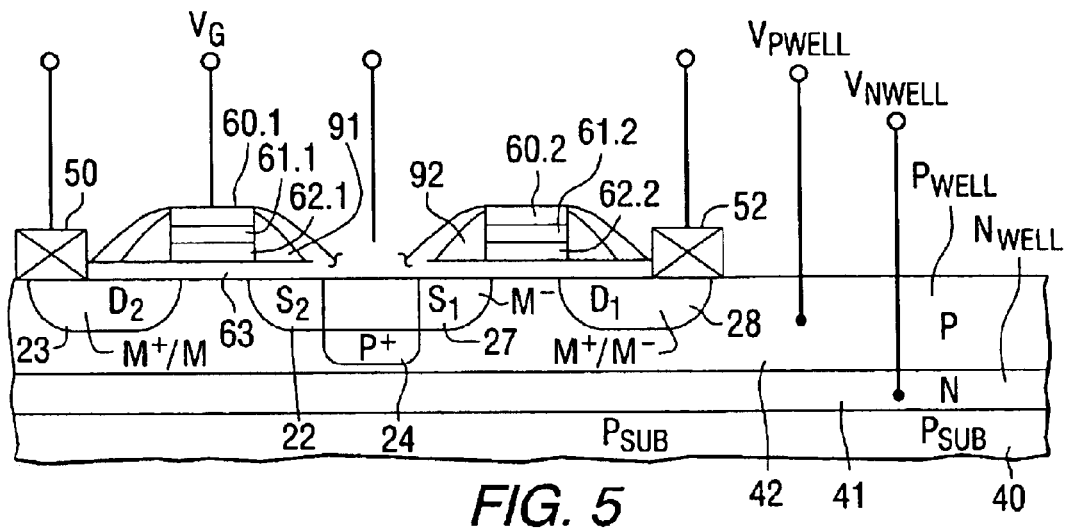
FIG. 5 is a cross section view taken along the line 5–5' of FIG. 4 and shows the structure of two serially connected floating gate transistors.

FIG. 5 shows a typical floating gate structure that includes an insulating tunnel oxide layer 63 (typically thin $SiO_2$ or oxynitride) on the surface of the substrate 40, a first conductive, charge storage layer on the insulating layer that forms the floating gate 62, an insulating, layer 61 (typically an ONO layer) on the lower conductive layer, and a second conductive layer on the charge storage layer that forms the control gate 60. In response to a set of voltages applied to the control electrodes and to the wells, charge may be stored, or erased from the floating gate transistor or the charging state will be sensed in the read mode. The function and operation of triple well floating gate transistors are known. Details of their structure, manufacture and operation are provided in one or more of my other patents or pending applications whose entire contents are herein incorporated by reference. My patent and pending applications include U.S. Pat. No. 6,307,781, and U.S. Ser. No. 10/234,344 filed Sep. 4, 2002 and Ser. No. 10/057,039, filed Jan. 25, 2002.

Portions of the active areas between deep trenches are masked and self-aligned openings to spacers 91, 92 in order to form body tie regions. Source regions 22, 27, 32, 37 and others are formed by implanting the substrate with suitable N-type dopants and diffusing the dopants into the P-wells 42. The deep trenches prevent the sources from laterally spreading into adjacent columns. The sources are further masked and self-aligned to spacers 91, 92. A P-type implant is made into the opening between spacers 91, 92 to form P+ body ties 24, 34 in the source regions. Thus each source is diffused via n−/P+ body tie to provide a continuous, buried bit line 14 in the common P-well 42. This buried bit line resistance is further reduced by subsequent silicide process prior to contact formation. Such silicidation must take place in the P+ 24 overlap the n− region, extend to both ends of n− region 22 and 27 but avoid extend to under the gate edge. Not every combined source region has a contact by a metal strap. It is sufficient to form contact with an upper level metal strap every thirty-two or sixty-four word lines 15 to reduce well resistance while maintain single metal line per bitline simplicity. The added upper level of metal is simple to add and does not adversely effect the footprint of the embedded memory array because its core processor already uses many level of metals.

Figure 7:
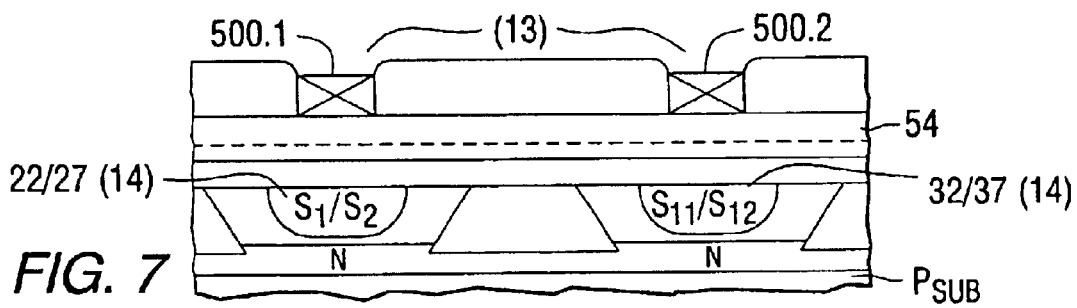
FIG. 7 is a cross sectional view taken along the line 7–7' and through source regions in a adjacent columns.

The transistors in a typical cell of the array are shown in FIG. 5. The substrate 40 has a deep N-well 41 and a shallow P-well 42. The transistors are in the P-well 42. From left to right, there is a drain region 23, a first floating gate stack (60.1, 61.1, 62.1), first and second sources 22, 27 with a P+ body tie 24, a second floating gate stack (60.2, 61.2, 62.2), and a second drain 28. Drain contacts 50, 52 extend above the substrate 40 to contact a raised metal bit line 500. Source regions 22, 27 form buried bit lines 14 that are vertically aligned with the raised metal bit lines. A higher (upper level) metal line runs in parallel with and above drain bit line 500 and contacts the source buried bit lines 14. The sources, drains and control gates are silicided. Sidewall oxide and spacers isolate the gates from the drains and sources. As shown in FIGS. 7 and 8, the deep trenches 46.1 and 46.2 separate adjacent columns and buried bit lines 14 from each other.

As a result of the above structure and the process for forming the structure, the invention achieves cell scaling and provides a uniform channel programming architecture that has buried bit lines with source and P-well ties to replace a conventional metal bit line. The invention saves one metal bit line per column for each column in the array when compared to prior art arrays. Likewise the source and the P-well are held at the same potential during programming, erase and read operations. With the invention, no surface source contact is needed due to the source and P-well and body tie. The invention introduces a true isolated well concept by isolating adjacent columns from each other using a deep trench isolation process. In this process, the trenches are etched to a depth of between 1 and 3 microns deep. This deep trench process may be used in conjunction with shallow trench isolation processes that are typically found in logic and linear designs. These and other objects in the invention are achieved by using P+ implants and silicide over the sources and after a spacer is provided in order to provide P+ body ties to the N− body sources.

The deep trench isolation not only reduces the area of the substrate required to isolate one column from the next. As such, the invention permits denser memory arrays with more cells per unit area than is possible with shallow trench isolation. The deep trench isolation also isolates the memory arrays from the high voltage devices including the row and column decoders, transfer gates, etc. As such, the invention further reduces the isolation area between the high voltage devices to less than one micron compared to the shallow trench isolation of several microns for isolating high voltage devices from memory arrays.

As such, the invention provides in a memory or combination memory, logic and/or linear device and an isolated triple-well structure for the flash memory cells. The triple well provides a separate biasing well for programming. The separate biasing well reduces the gate induced drain leakage. As such, a smaller charge pump may be used and the memory device may be operated at lower power. The deep trench isolation of the invention creates decoupling capacitors when the trenches fill with doped material and properly insulating from the top surface, whose capacitance values are few order of magnitude higher than conventional well capacitors and consume much less area; suitable for charge pump design and provides a significant area reduction. In the past, when memory devices have been incorporated with high voltage devices, it was conventional to use shallow trench isolation for the memory transistors and the high voltage transistors with large isolation space (e.g. N+/N+, N+/P+, P+/P+). However, high voltage transistors require more spacing than do memory transistors. By using shallow trench isolation for high voltage devices and deep trench isolation for memory devices, the overall device size is reduced, mostly due to isolation space reduction which was enable by the deep trench technology.

Figure 9:
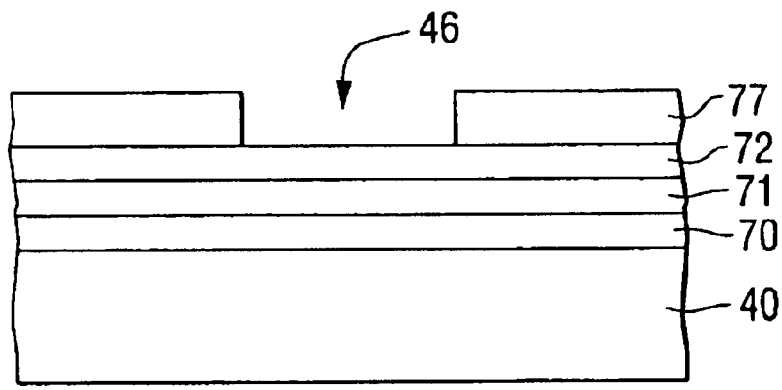
FIGS. 9–11 show steps for making the deep trenches.
Figure 10:
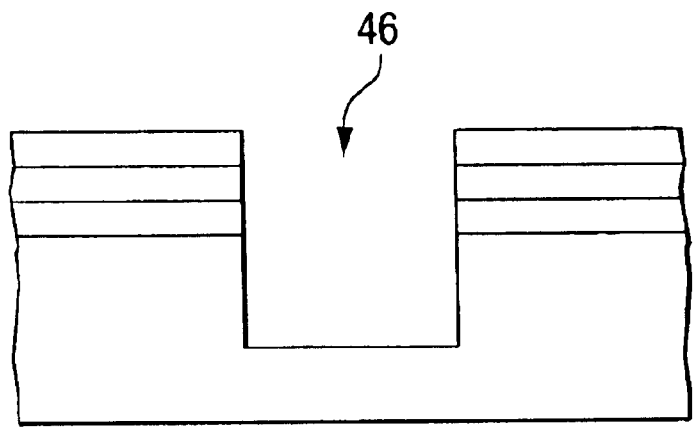
Figure 11:
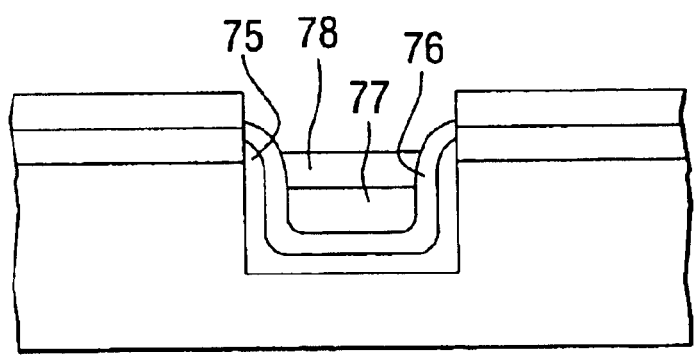

Turning to FIGS. 9–10, there are shown the steps involved in fabricating the deep trench 46 of the invention. The deep trench is formed at the beginning of the process generally before the shallow trench isolation that is used to separate the high voltage and CMOS devices. This provides a modular approach for System-on-Chip (SoC) and avoids any unwarranted effects introduced by the addition of deep trench process on the base logic process. The following flow is just one embodiment for making devices with the invention. Those skilled in the art will understand that other process steps may be used to achieve equivalent process flow and equivalent devices. As such, the following example is for illustration purpose. The details such as film thickness, deposit temperature, additional films or integration can be varied.

In order to form the deep trench of the invention, a pad oxide layer 70 is deposited on the substrate 40. The pad oxide is approximately 53 angstroms thick. Next a pad nitrite layer 71 with a thickness of 1800 angstroms is deposited over the pad oxide layer. A layer of BSG 72 is deposited on the pad nitrite layer 71. BSG 72 is patterned by a photoresist mask 73. The mask provides openings 46 that will ultimately become the deep trenches shown in FIG. 9.

First the BSG 72 is removed from the trench followed by resist strip and clean that leaves BSG on active region as a hardmask to protect the substrate from the subsequent deep trench etch. Next is the main Si etch by removal of the nitrite and pad oxide layers and then a portion of the substrate material 40 to provide the deep trench structure shown in FIG. 10. Part of the BSG 72 on active region was removed during the deep trench etch. The remaining BSG over the active region are subsequently removed. Then the trench is filled with a series of four layers. One of the features of this invention is that the trench is formed with a compound dielectric layer on its side walls and bottom. Initially, a layer of $Si_3N_4$ 75 is deposited using low pressure chemical vapor deposition to form a 4.3 nanometer coating on the walls and floor of the trench. Thereafter, the trench is exposed to dry oxygen and 900 degrees centigrade in order to oxidize portions of the silicon nitride layer and thereby form a composite dielectric of approximately 5.0 nanometers thickness. The dielectric is further exposed to the rapid thermal nitridation process to convert the top layer into oxynitride (76). Next, using a low pressure chemical vapor deposition process undoped amorphous polysilicon 77 is deposited in the trench. The polysilicon is chemically and mechanically polished to provide a recess of approximately 0.5 microns. The remainder of the trench is filled with a chemical vapor deposition layer of TEOS that is approximately 5000 angstroms thick. The TEOS 78 is then chemically and mechanically polished. Thereafter, the high voltage, CMOS and memory devices may be formed in accordance with the process steps known in the art or set forth in my co-pending U.S. patent application Ser. No. 10/234,334 filed Sep. 4, 2002 and incorporated herein by reference. The process disclosed in that co-pending application is carried through until just prior to forming the N+ source and drains and P+ source and drains of the CMOS and memory devices. At that point, the process described at the beginning of this specification is inserted in order to form the buried source bit line of the invention. During formation of the buried source bit line of the invention, the rest of the device is masked so that only the sources of the memory array are formed. Likewise, after completion of formation of the memory array, the memory array is then masked and the CMOS devices are opened in order to form the N+ and P+ sources and drains.

The process described above may be modified still used deep trench isolation formation and add decoupling capacitor. This may be achieved by replacing the undoped polysilicon 77 with a doped polysilicon in a well known in-situ doped process; e.g. doping is through gas flow during the deposition for better uniformity. Suitable gases such as phosphine ($PH_3$) and $B_2H_6$ for N-doped and P-doped polysilicon, respectively, are flowed over the deep Nwells for positive polarity, or over the Pwell or substrate for negative polarity. For the memory array portion, we follow above flow with the polysilicon chemically and mechanically polished to provide a recess of approximately 0.5 microns. The remainder of the trench is filled with a chemical vapor deposition layer of TEOS that is approximately 5000 angstroms thick. For the decoupling capacitor portion, none or a small recess is provided in the end and the process adds contacts for the top electrode connection.

Figure 12:
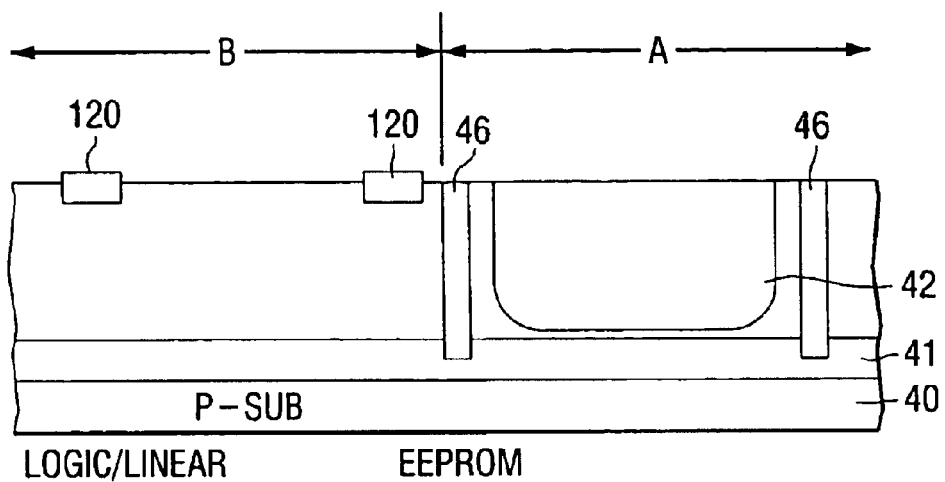
FIGS. 12–19 show steps for making a system on chip devices with memory, logic and linear transistors.
Figure 13:
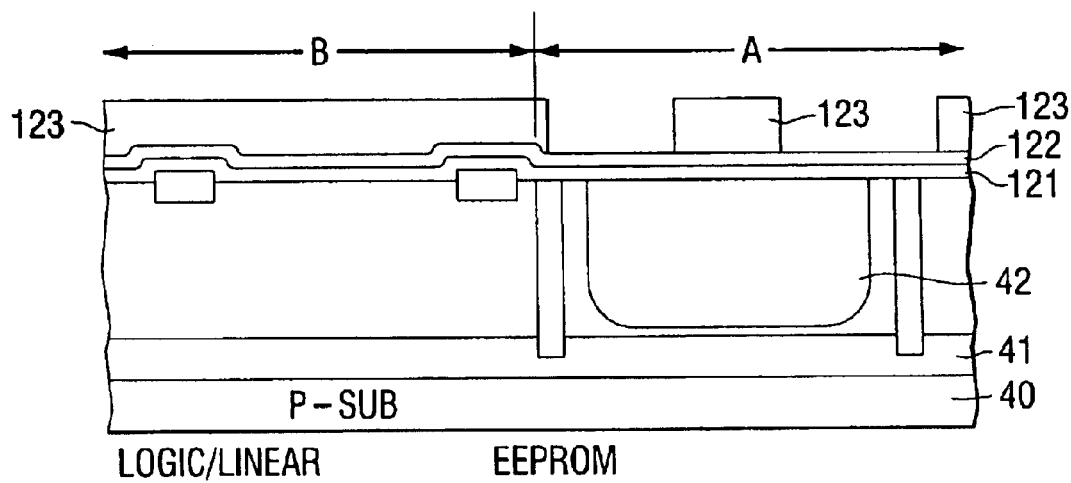

Turning to FIG. 12, the P-type substrate 40 is suitably patterned to form shallow trench isolation regions 120. The trench isolation regions 120 each pair of CMOS transistors and any linear or high voltage devices formed on the substrate. The deep trenches 46 separate the memory columns from each other and from the other devices. Those skilled in the art understand that the invention may be made on an N-type substrate where the dopings are suitable reversed. As shown in FIG. 13, the substrate is then covered with a floating gate oxide 121 followed by a layer 122 of polysilicon. Prior to deposition of the layers, a suitable portion of the substrate, such as portion A, is separately patterned and implanted to have a triple-well comprising N-well 41 that encloses P-well 42. A logic CMOS pair of transistors are in region B. Those B regions may include transistors other than CMOS logic pairs. Those skilled in the art understand that transistor of one conductivity type may be formed in the B regions and types of transistors may be logic or linear, including and not limited to power transistors such as LDMOS transistors.

Figure 14:
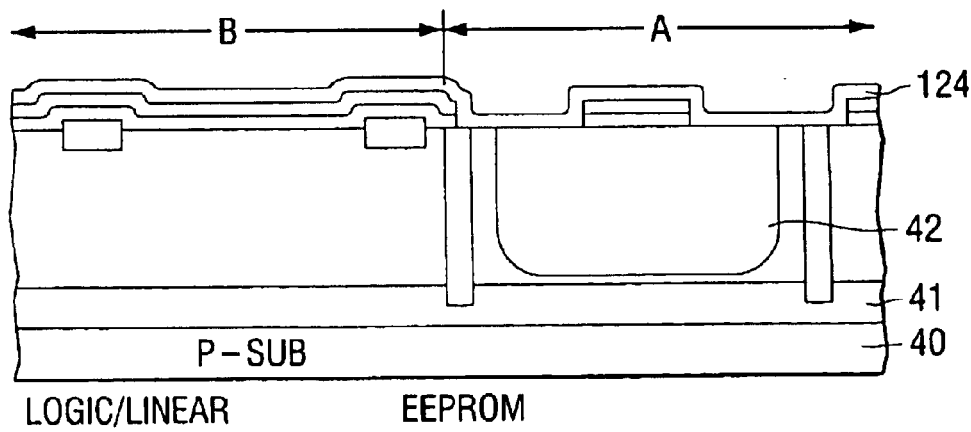
Figure 15:
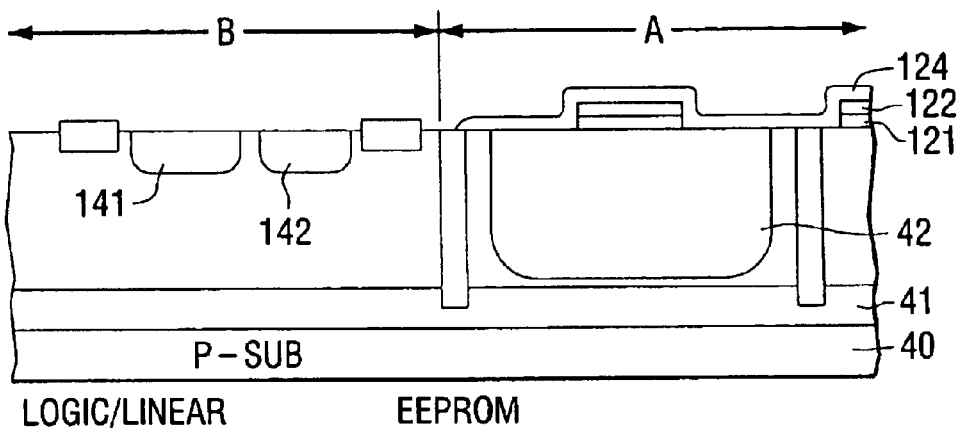

The oxide and polysilicon layers are then patterned with photoresist 123 to form a floating gate slot (parallel to bitline). Turning to FIG. 14, a layer 124 of ONO interpoly dielectric is deposited over the substrate. The layer 124 comprises sequentially a thermally grown bottom oxide, a deposited layer of low temperature deposited polysilicon that is re-oxidized to form top oxide at later time. The layer 124 is suitably patterned by photoresist 123 to for two of the three layers of the ONO interpoly dielectric in the EEPROM stack as shown in FIG. 15. At this point, the layer 124 and polysilicon layer 111 are stripped from the peripheral regions B and they are suitably patterned and implanted to form P-wells 142 and N-wells 141.

Figure 16:
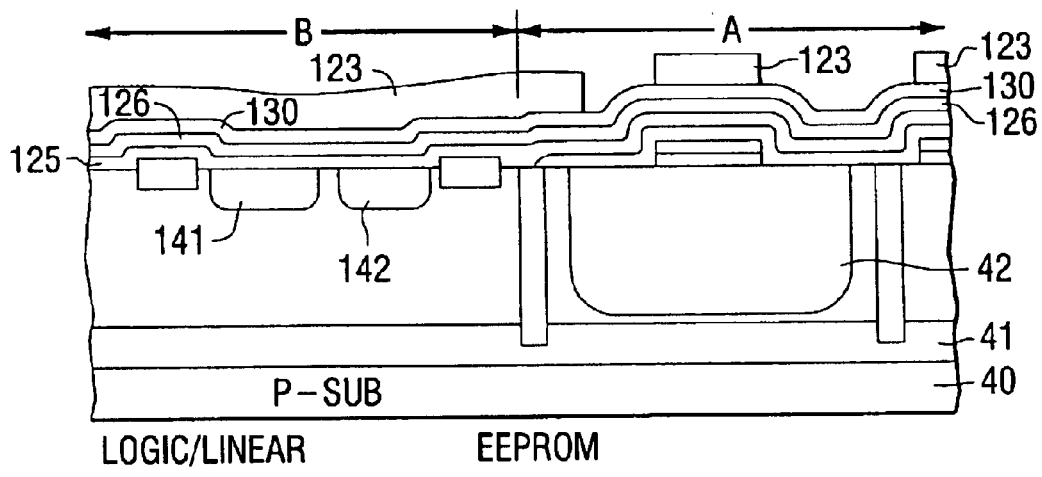

As shown in FIG. 16, the substrate 40 is covered with a layer 125 of oxide followed by a second layer of polysilicon 126. The layer 125 forms the gate oxide layer for the logic and linear devices and forms the upper oxide layer of the ONO dielectric layer 124. The polysilicon layer 126 is patterned and etched to form the control gates of the EEPROM transistors and the logic and linear transistors.

Figure 17:
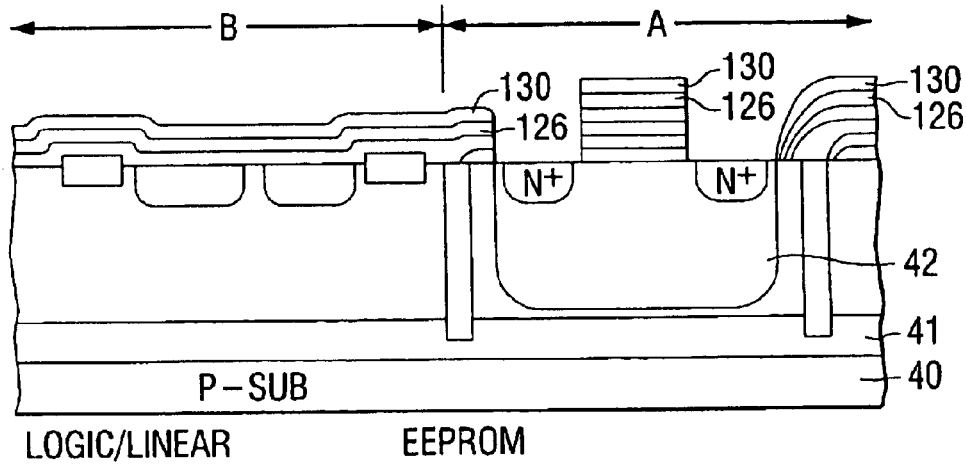
Figure 18:
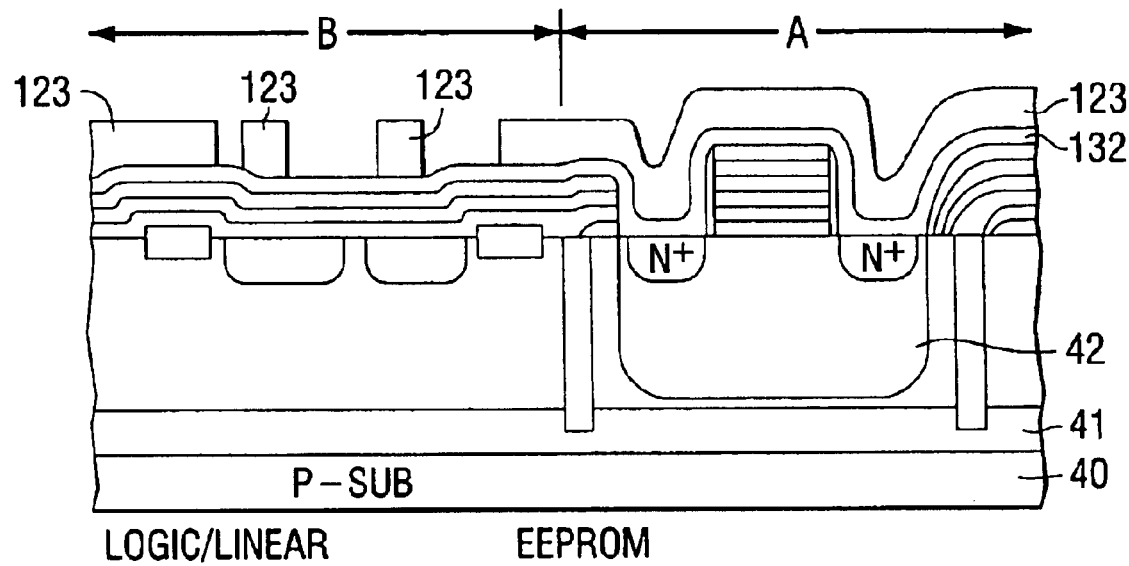
Figure 19:
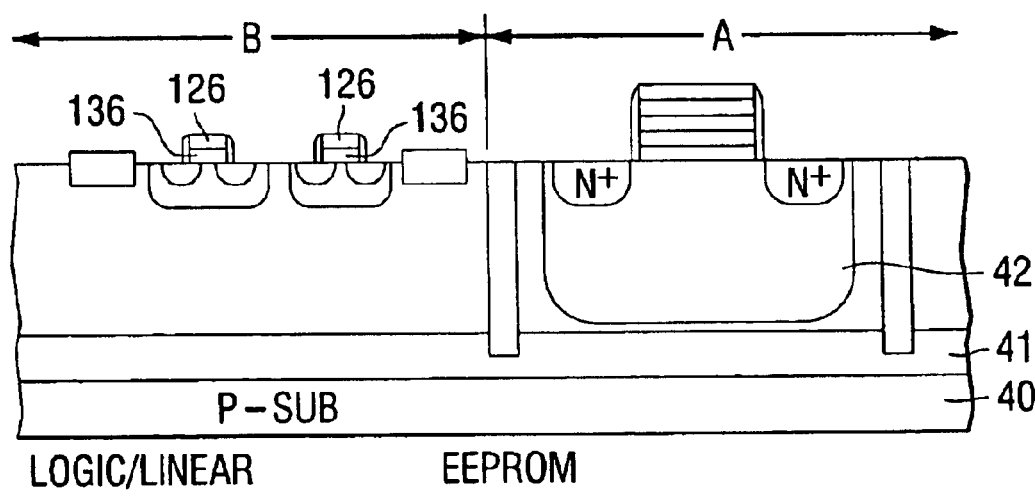

The description below creates a dual sidewall oxide that optimizes a memory cell's reliability and maintains a shallow logic device S/D junction, similar to my copending U.S. patent application Ser. No. 10/234,344, filed Sep. 4, 2002. A first TEOS layer 130 is deposited over the second polysilicon layer 126. The first TEOS layer 130 is then suitably patterned with photoresist 123 to open the source and drain regions of the EEPROM. Source and drain regions are suitably implanted to form the source and drains of the EEPROM. (See FIG. 17) After that, the first TEOS layer 130 is removed by a high selective reactive ion etching, stopping on polysilicon layer 126. Then the sidewalls of the gate stack of the EEPROM are oxidized to provide a sidewall oxide suitable for flash stack transistors. Oxidation takes place at about 850–950° centigrade in a furnace for approximately 30 minutes in order to grow a sidewall that is about 15 manometers thick on the polysilicon regions of the gate stack. (See FIG. 18) Thereafter, a second TEOS layer 132 is deposited over the substrate 40. TEOS layer 132 is suitably patterned with a photoresist layer 123 to form the gates and to open the source and drains of the logic and linear transistors. (See FIG. 19)

The sources and drains of the logic and/or linear transistors are implanted, the second TEOS layer 132 is removed by reactive ion etching and the gates of the peripheral transistors receive a thinner sidewall oxide. That sidewall oxide is approximately 6 nanometers and is generated by a relatively short rapid thermal annealing step. The rapid thermal annealing is carried out at about 700–900° C. for about 10–20 second. It activates the doping in the logic and/or linear transistors but does not drive them very far into the substrate. This results in a logic and/or linear region with relatively closely spaced transistors.

Then the substrate is masked to expose only selected source regions in the memory array. Those regions are exposed and implanted with a P-type implant to form the P+ body ties, to the source N− junctions of the memory. Additional metal straps from upper levels of metal (e.g. M3) will bring the source rail resistance down. Not every source regions requires a metal strap and every thirty-second or sixty-fourth source region is sufficient. No bitline pitch increase due to the addition of metal strap M3 since both M1 bitline and M3 source line run on top of each other. Those skilled in the art can realize the benefit and achieve a 50% cell area reduction or ~30% chip reduction.

As a result of the process described above a manufacturer may produce a single integrated circuit with logic and/or linear and memory devices having different sidewall insulating thicknesses. In the logic and/or linear region the sidewalls can be optimized to be as thin as needed to provide more transistor in the region allowed for logic and/or linear devices. In the memory region the memory devices are optimized to have a thick enough sidewall oxide to prevent the charge stored in the interpoly dielectric layer from having an unwanted effect on the operation of the memory transistors.

The triple well allows the user to control the voltage on the deep buried N-well 41 and the shallow P-well 42 in order to program, erase and read the array. A typical set of operating parameters to program, erase and read appears in the following table where the voltages applied to the selected and unselected components are identified.

TABLE 1

|  | Read (volts) | Program (volts) | Erase (volts) |
|---|---|---|---|
| Selected Cells |  |  |  |
| Gate | VPP = 2.5 | +14 volts | −14 |
| Drain) | VDD = 1.2 | −3 | +3 |
| Source/P-Well | 0 | −3 | +3 |
| Deep N-Well | 0 | 0 | +3 |
| Unselected Cells |  |  |  |
| Gate | 0 | 0/−3 | 0/+3 |
| Drain disturb | DR turn-on |  |  |
| Drain | 0 | +3 | +3 |
| Gate disturb | R. disturb |  |  |
| Source/P-well | 0 | +3 | +3 |
| Deep N-well | 0 | +3 | +3 |

In operation, when the user desires to read the contents of a given transistor cell, the word line associated with the transistor is raised to approximately 2.5 volts. Likewise, the bit line connected to the drain is coupled to a voltage of approximately 1.25 volts. The output of the cell then appears on the other or source bit line. The deep N well is held at zero volts. The voltages for all of the other electrodes of the rest of the array are set to zero volts.

In order to program a transistor, the word line of the gate with the selected transistor are raised to +14 volts. The drain bit line is lowered to −3 volts as is the buried source bit line to provide a uniform voltage across the channel. The deep N well 41 is set to zero volts. The gates of the unselected transistors are either set to zero or −3 volts and the other electrodes are set to +3 volts. In order to erase a program transistor, the drain and the source bit lines are set to +3 volts and the gate is set to −14 volts. The gates of the unselected transistors are set to between zero and +3 volts and all of the other electrodes are set to +3 volts.

Figure 6:
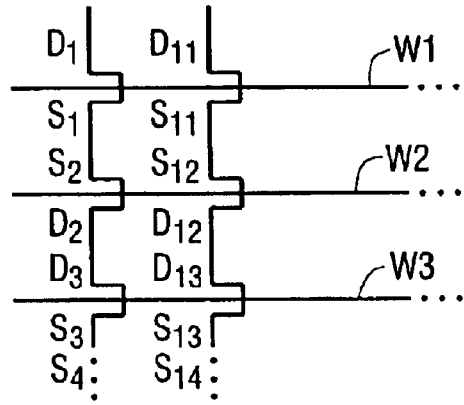
FIG. 6 is a partial electrical schematic of the array.

The configuration of the array is shown schematically in FIG. 6. The drain and source regions are aligned with each other in a given column and the columns 11.n are parallel to each other. The word lines 15.n run transverse to the columns 11.n. The drains are connected together by a first, raised bit line 13. The sources are connected together by a buried bit line 14. With this arrangement, there source and drain regions are aligned with each other and require minimal active areas. Likewise, there is only one metal line. This reduces the complexity of interconnecting the transistors and save valuable space in the active areas of the device. With the invention only one set of vias and vertical contacts are needed for the single metal line.

Having thus disclosed the salient features of the invention, those skilled in the art will appreciate that further changes, additions, substitutions and changes may be made to the above details without departing from the spirit and scope of the appended claims.

What is claimed is:

1. A semiconductor device with an array of flash memory cells comprising:
    a semiconductor substrate;
    a repeated cell arranged in columns and rows and comprising transistors with floating gates;
    in each cell a common source for adjacent transistors;
    first and second floating gates on opposite sides of the common source;
    first and second drains, respectively, on the other side of the first and second floating gates;
    wherein the common sources are connected together in a buried bit line in the substrate and the drains are aligned with each other and connected to a metal contact layer disposed over the substrate and aligned with the drains and source.

2. The device of claim 1 further comprising a deep trench disposed between adjacent columns for isolating the transistors in each column from the transistors in the adjacent columns.

3. The device of claim 2 having a substrate of a first polarity, a deep well of a second and opposite polarity, wherein the deep trench extends to or beyond the depth of the deep well of the second polarity.

4. The device of claim 1 wherein each common source has a body tie of opposite polarity to the source polarity.

5. The device of claim 4 wherein the body ties are self-aligned to spacers on the gates of the transistors.

6. The device of claim 2 wherein the deep trench isolation regions provide capacitors for charge pumps for the memory cells.

7. The device of claim 1 further comprising logic or linear devices disposed on the surface and separated from each other by shallow trench isolation regions.

8. A semiconductor device with a flash memory array comprising a plurality of floating gate transistors, said transistors arranged with their sources and drains aligned in columns;
    a plurality of word lines extending transverse to the column to form a plurality of rows, with each word line connected to the floating gates of the transistors beneath the word line;
    each column comprising a plurality of first and second floating gate transistors wherein each first and second floating gate transistor has a drain, a source and floating gate between its drain and source;
    a common source region disposed between opposite sides of the first and second floating gates and providing the sources for two adjacent transistors;
    a deep trench disposed between adjacent columns for isolating the transistors in each column from the transistors in the adjacent columns;
    a first and second drain regions disposed respectively on the other sides of the first and second floating gates;
    a plurality of first bit line buried beneath the surface of the substrate and connecting together in each column the common sources of the floating gate transistors;
    drain contacts aligned with each other in the same columns as the sources for contacting the first and second drains of the first and second floating gate transistors in each column;
    an insulation layer over the substrate for laterally isolating drain contacts from each other;
    a plurality of second bit lines, each second bit line extending substantially parallel to its corresponding column, over the insulation layer and extending through the insulation layer to contact the drain contacts in each column of the array.

9. The semiconductor device of claim 8 having a substrate of a first polarity, a deep well of a second and opposite polarity, wherein the deep trench extends to or beyond the depth of the deep well of the second polarity.

10. The semiconductor device of claim 8 wherein each common source has a body tie of opposite polarity to the source polarity.

11. The semiconductor device of claim 10 wherein the body ties are self-aligned to spacers on the gates of the transistors.

12. The semiconductor device of claim 8 wherein the deep trench isolation regions provide capacitors for charge pumps for the memory cells.

13. The semiconductor device of claim 8 further comprising logic or linear devices disposed on the surface and separated from each other by shallow trench isolation regions.

14. A semiconductor device having a memory array comprising:
    memory cells in a semiconductor substrate;
    a word line that includes control electrodes for a first plurality of the memory cells,
    a first bit line electrically connecting first current carrying electrodes for a second plurality of the memory cells; and
    a second bit line electrically connecting second current carrying electrodes of a third plurality of the memory cells; and
    wherein within the memory array, the first bit line buried in the substrate, and the second bit line disposed over the substrate, vertically spaced from the first bit line, and extending substantially parallel to the first bit line and at an elevation different from the word line.

15. The semiconductor device of claim 14 further comprising a deep trench disposed between adjacent columns for isolating the transistors in each column from the transistors in the adjacent columns.

16. The semiconductor device of claim 14 having a substrate of a first polarity, a deep well of a second and opposite polarity, wherein the deep trench extends to or beyond the depth of the deep well of the second polarity.

17. The semiconductor device of claim 14 wherein each common source has a body tie of opposite polarity to the source polarity.

18. The semiconductor device of claim 17 wherein the body ties are self-aligned to spacers on the gates of the transistors.

19. The semiconductor device of claim 15 wherein the deep trench isolation regions provide capacitors for charge pumps for the memory cells.

20. The semiconductor device of claim 14 further comprising logic or linear devices disposed on the surface and separated from each other by shallow trench isolation regions.

21. A system on chip semiconductor device comprising:
a plurality of logic devices;
a plurality of linear devices;
shallow trench isolation regions separating the logic devices from each other and separating the linear devices from each other;
an array of memory cells comprising:
a word line that includes control electrodes for a first plurality of the memory cells,
a first bit line electrically connecting first current carrying electrodes for a second plurality of the memory cells; and
a plurality of columns, each column having
a second bit line electrically connecting second current carrying electrodes of a third plurality of the memory cells;
a deep trench disposed between adjacent columns for isolating the transistors in each column from the transistors in the adjacent columns; and
wherein within the memory cell array, the first bit line buried in the substrate, and the second bit line disposed over the substrate, vertically spaced from the first bit line, and extending substantially parallel to the first bit line and at an elevation different from the word line.

22. The semiconductor device of claim 21 having a substrate of a first polarity, a deep well of a second and opposite polarity, wherein the deep trench extends to or beyond the depth of the deep well of the second polarity.

23. The semiconductor device of claim 21 wherein each common source has a body tie of opposite polarity to the source polarity.

24. The semiconductor device of claim 21 wherein the body ties are self-aligned to spacers on the gates of the transistors.

25. The semiconductor device of claim 21 wherein the deep trench isolation regions provide capacitors for charge pumps for the memory cells.

26. A process for fabricating a system on chip device in a semiconductor substrate, the device having low power logic devices, higher power driver devices and a flash memory array comprising a plurality of floating gate transistors, said floating gate transistors arranged with their sources and drains aligned in columns;

forming a plurality of word lines extending transverse to the columns to form a plurality of rows, with each word line connected to the floating gates of the transistors beneath the word line;
forming columns comprising a plurality of first and second floating gate transistors wherein each first and second floating gate transistor has a drain, a source and floating gate between its drain and source;
in each column forming common source regions disposed between opposite sides of the first and second floating gates to provide the sources for two adjacent transistors;
in each column forming first and second drain regions disposed respectively on the other sides of the first and second floating gates;
in each column forming drain contacts aligned with the sources for contacting the first and second drains of the first and second floating gate transistors in each column;
in each column forming a first bit lines buried beneath the surface of the substrate for connecting together the common sources of the floating gate transistors;
in each column forming a second raised bit line disposed over the substrate and over the buried bit line and having contacts extending to the surface to contact the drains on floating gate transistors in the column; and
forming a deep trench disposed between adjacent columns for isolating the transistors in each column from the transistors in the adjacent columns.

27. The process of claim 26 further comprising implanting body tie dopants into the source regions to form body ties and siliciding the body ties.

28. The process of claim 26 wherein the body tie implants have a polarity opposite to the polarity of the source regions.

29. The process of claim 26 comprising:
forming first wells of a polarity opposite the polarity of the sources and drains;
forming seconds wells surrounding the first wells and of a polarity the same as the sources and drains;
forming third wells of a polarity the same as the first well;
forming the deep trenches deep enough to penetrate the second wells.

30. The process of claim 26 wherein the third wells comprises the substrate.

* * * * *